US006486702B1

(12) United States Patent
Ngai et al.

(10) Patent No.: US 6,486,702 B1
(45) Date of Patent: Nov. 26, 2002

(54) EMBEDDED MEMORY BLOCKS FOR PROGRAMMABLE LOGIC

(75) Inventors: Tony Ngai, Campbell; Sergey Shumarayev, San Leandro; Wei-Jen Huang, Burlingame; Rakesh Patel, Cupertino; Tin Lai, San Jose, all of CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 09/609,102

(22) Filed: Jun. 30, 2000

Related U.S. Application Data

(60) Provisional application No. 60/142,141, filed on Jul. 2, 1999.

(51) Int. Cl.[7] ............................................. H03K 19/177
(52) U.S. Cl. ......................................... 326/40; 326/47
(58) Field of Search ............................... 326/40, 37–39, 326/41, 46, 47, 101

(56) References Cited

U.S. PATENT DOCUMENTS

| 4,293,783 A | 10/1981 | Patil |
| 4,825,414 A | 4/1989 | Kawata |
| 4,855,958 A | 8/1989 | Ikeda |
| 4,963,770 A | 10/1990 | Keida |
| 4,975,601 A | 12/1990 | Steele |

(List continued on next page.)

FOREIGN PATENT DOCUMENTS

| EP | 0081917 | 8/1983 |
| EP | 0410759 A2 | 1/1991 |
| EP | 0415542 A2 | 3/1991 |
| EP | 0420389 A1 | 4/1991 |

(List continued on next page.)

OTHER PUBLICATIONS

Ngai, Tony, "An SRAM–Programmable Field–Reconfigurable Memory," Presentation at University of Toronto, Canada, Jun. 1993, pp. 1–14.

Seitz, "Concurrent VLSI Architectures," IEEE Trans. on Computers, vol. C–33, No. 12, Dec. 1984, pp. 1247–1248.

Masumoto, Rodney T., "Configurable On–Chip RAM Incorporated into High Speed Logic Array," IEEE Custom Integrated Circuits Conference, Jun. 1985, CH2157–6/85/0000–0240, pp. 240–243.

Landry, Steve, "Application–Specific ICs, Relying on RAM, Implement Almost Any Logic Function," Electronic Design, Oct. 31, 1985, pp. 123–130.

(List continued on next page.)

Primary Examiner—Michael Tokar
Assistant Examiner—James H Cho
(74) Attorney, Agent, or Firm—Townsend and Townsend and Crew LLP

(57) ABSTRACT

A high-performance programmable logic architecture has embedded memory (608). arranged at the peripheries or edges of the integrated circuit. This enhances the performance of the programmable logic integrated circuit by shortening the lengths of the programmable interconnect (748). In a specific embodiment, the memory blocks (703) are organized in rows along the top and bottom edges of the integrated circuit. The logic elements (805) can be directly programmable routed and connected to driver blocks (809) of the logic block in adjacent rows and columns. This permits fast interconnection of signals without using the global programmable interconnect resources (815, 825). Using similar direct programmable interconnections (828, 830, 835), the logic blocks can directly programmable connect to the memory blocks without using the global programmable interconnect resources. The present invention also provides technique of flexibly combining or stitching multiple memories together to form memories of a desired size.

25 Claims, 10 Drawing Sheets

U.S. PATENT DOCUMENTS

| | | |
|---|---|---|
| 5,042,004 A | 8/1991 | Agrawal et al. |
| 5,122,685 A | 6/1992 | Chan et al. |
| RE34,444 E | 11/1993 | Kaplinsky |
| 5,313,119 A | 5/1994 | Cooke et al. |
| 5,315,178 A | 5/1994 | Snider |
| 5,329,460 A | 7/1994 | Agrawal et al. |
| 5,343,406 A | 8/1994 | Freeman et al. |
| 5,352,940 A | 10/1994 | Watson |
| 5,408,434 A | 4/1995 | Stansfield |
| 5,414,377 A | 5/1995 | Freidin |
| 5,426,378 A | 6/1995 | Ong |
| 5,550,782 A | 8/1996 | Cliff et al. |
| 5,559,450 A | 9/1996 | Ngai et al. |
| 5,566,123 A | 10/1996 | Freidin et al. |
| 5,668,771 A | 9/1997 | Cliff et al. |
| 5,705,938 A | 1/1998 | Kean |
| 5,717,901 A | 2/1998 | Sung et al. |
| 5,744,980 A | 4/1998 | McGowan et al. |
| 5,777,489 A | 7/1998 | Barbier et al. |
| 5,801,547 A | 9/1998 | Kean |
| 5,809,281 A | 9/1998 | Steele et al. |
| 5,835,405 A | 11/1998 | Tsui et al. |
| 5,933,023 A * | 8/1999 | Young .......................... 326/40 |
| 5,949,991 A * | 9/1999 | LeBlanc ................ 395/500.35 |
| 6,072,332 A | 6/2000 | Pederson ...................... 326/40 |
| 6,075,380 A * | 6/2000 | Lane ............................ 326/40 |
| 6,150,839 A * | 11/2000 | New et al. ..................... 326/40 |
| 6,191,990 B1 * | 2/2001 | Reddy et al. .......... 365/230.05 |

FOREIGN PATENT DOCUMENTS

| | | |
|---|---|---|
| EP | 0507507 A2 | 10/1992 |
| EP | 0530985 A2 | 3/1993 |
| EP | 0569137 A2 | 11/1993 |
| EP | 0746102 A2 | 12/1996 |
| JP | 01091525 A | 4/1989 |
| JP | 01091526 A | 4/1989 |
| WO | WO 94/10754 | 5/1994 |
| WO | WO 97/30517 | 8/1997 |
| WO | WO 98/10517 | 3/1998 |

OTHER PUBLICATIONS

Bursky, Dave, "Shrink Systems with One–Chip Decoder, EPROM, and RAM," Electronic Design, Jul. 28, 1988, pp. 91–94.

Kawana, Keiichi et al., "An Efficient Logic Block Interconnect Architecture for User–Reprogrammable Gate Array," IEEE 1990 Custom Integrated Circuits Conf., May 1990, CH2860–5/90/0000–0164, pp. 31.3.1 to 31.3.4.

Shubat, Alexander et al., "A Family of User–Programmable Peripherals with a Functional Unit Architecture," IEEE Jor. of Solid–State Circuits, vol. 27, No. 4, Apr. 1992, 0018–9200/92$03.00, pp. 515–529.

"AT&T's Orthogonal ORCA Targets the FPGA Future," 8029 Electronic Engineering, 64, No. 786, Jun. 1992, pp. 9–10.

Bursky, Dave, "FPGA Advances Cut Delays, Add Flexibility," 2328 Electronic Design, 40, No. 20, Oct. 1, 1992, pp. 35–43.

Smith, Daniel, "Intel's FLEXlogic FPGA Architecture," IEEE 1063–6390/93, 1993 pp. 378–384.

Bursky, Dave, "Denser, Faster FPGAs Vie for Gate–Array Applications," 2328 Electronics Design, 41, No. 11, May 27, 1993, pp. 55–75.

Kautz, "Cellular Logic in Memory Arrays," IEEE Trans. on Computers, vol. C–18, No. 8, Aug. 1969, pp. 719–727.

Stone, "A Logic in Memory Computer," IEEE Trans. on Computers, Jan. 1970, pp. 73–78.

Manning, "An Approach to Highly Integrated Computer Maintained Cellular Arrays," IEEE Trans. on Computers, vol. C–26, No. 6, Jun. 1977,pp. 536–552.

Patil et al., "A Programmable Logic Approach for VLSI," IEEE Trans. on Computers, vol. C–28, No. 9, Sep. 1979, pp. 594–601.

Hsieh et al., "Third Generation Architecture Boosts Speed and Density of Field Programmable Gate Arrays," Proc. of IEEE CICC Conf., May 1990, pp. 31.2.1 to 31.2.7.

Bursky, "Combination RAM/PLD Opens New Application Options," Electronic Design, May 23, 1991, pp. 138–140.

Ling et al., "WASMII: A Data Driven Computer on a Virtual Hardware," Proc. of IEEE Field Prog. Custom Computing Machines Conf., Napa, California, Apr. 1993, pp. 33–42.

Casselman, "Virtual Computing and The Virtual Computer," IEEE, Jul. 1993, p. 43.

Quenot et al., "A Reconfigurable Compute Engine for Real–Time Vision Automata Prototyping," Proc. of IEEE FCCM Conf., Napa, California, Feb. 1994, pp. 91–100.

Plus Logic "FPSL5110 Intelligent Data Buffer" Product Brief, Plus Logic, Inc., San Jose, California, Oct. 1990, pp. 1–6.

Larsson, T, "Programmable Logic Circuits: The Luxury Alternatives are Coming Soon," Elteknik–med–Aktuell Electronik, No. 4, Feb. 25–Mar. 9, 1988, pp. 37–38, (with English abstract).

Intel Preliminary Datasheet, "iFX780: 10ns FLEXlogic FPGA with SRAM Option," Nov. 1993, pp. 2–24 to 2–46.

Quinnell, Richard A., "FPGA Family Offers Speed, Density, On–Chip RAM, and Wide–Decode Logic," EDN Dec. 6, 1990, pp. 62–63.

Satoh, Hisayasu et al., "A 209K–Transistor ECL Gate Array with RAM," IEEE Jor. of Solid–State Circuits, vol. 24, No. 5, Oct. 1989, pp. 1275–1279.

Ngai, Kai–Kit Tony, "An SRAM–Programmable Field–Reconfigurable Memory," Manuscript Thesis, The University of Toronto Library, Aug. 18, 1994, pp. 1–68.

Reddy, S. et al., "A High Density Embedded Array Programmable Logic Architecture," Proc. of the IEEE 1996 Custom Integrated Circuits Conf. (CICC), San Diego, California, May 5–8, 1996, pp. 251–254.

Brown, S. et al., "FPGA and CPLD Architectures: A Tutorial," IEEE Design & Test of Computers, vol. 13, No. 2, Jun. 1, 1996, pp. 42–57.

Altera 1996 Data Book, "FLEX 10K Embedded Programmable Logic Family," Jun. 1996, pp. 29–90.

Nelson, Rick, "Embedded Memory Enhances Programmable Logic for Complex, Compact Designs," EDN Electrical Design News, vol. 41, No. 23, Nov. 7, 1996, pp. 91–106.

Altera 1999 Device Data Book, "APEX 20K Programmable Logic Device Family," May 1999, pp. 23–88.

Xilinx Corporation Data Sheet, "Virtex™ 2.5 V Field Programmable Gate Arrays," Jan. 28, 2000, pp. 1–72.

Xilinx Corp., *The Programmable Logic Data Book*, "XC4000, XC4000A, XC4000H Logic Cell Array Families," pp. 2–7 to 2–46 (1994).

* cited by examiner

EMBEDDED MEMORY BLOCKS FOR PROGRAMMABLE LOGIC

CROSS-REFERENCES TO RELATED APPLICATIONS

This application claims the benefit of U.S. provisional application 60/142,141, filed Jul. 2, 1999, which is incorporated by reference along with all references cited in this application.

BACKGROUND OF THE INVENTION

The present invention relates to the field of integrated circuits and in particular, to architectures for memory within a programmable logic integrated circuit to improve performance.

Programmable logic integrated circuits such as PALs, PLDs, FPGAs, LCAs, and others are becoming more complex and continually evolving to provide more user-programmable features on a single integrated circuit. Modern programmable logic integrated circuits incorporate programmable logic including logic gates, products terms, or look-up tables. Programmable logic integrated circuits also included embedded user-programmable memory or RAM.

Despite the success of programmable logic, there is a continuing desire to provide greater functionality in a programmable logic integrated circuit, but at the same time, provide greater performance. There is a need to provide more higher performance user memories. Larger memory sizes or providing more memory blocks typically negatively impacts the performance of the integrated circuit because the integrated circuit is larger. There is programmable interconnect (e.g., GH and GV lines) will usually be longer and there will be greater capacitance. This reduces performance. It is desirable to have a high-speed interface and interconnections between the logic blocks and the memory blocks. Further, it is desirable to provide flexible stitching together or combining of the user memories in space-efficient and high performance manner.

Therefore, there is a need to provide high performance address decoding techniques and circuitry in order to improve the performance of the integrated circuit.

SUMMARY OF THE INVENTION

The present invention provides a high-performance programmable logic architecture with embedded memory. Memory blocks are arranged at the peripheries or edges of the integrated circuit so in order to shorten the lengths of the programmable interconnect. In a specific embodiment, the memory blocks are organized in memory block rows along the top and bottom edges of the integrated circuit. The memory blocks may also be organized in columns at the left and right edges for similar benefits. Each logic block is separated into a driver block and logic elements. Flip chip technology is used so IO bands for the integrated circuit are within the core of the integrated circuit; there are no IO bands between the memory blocks and the edges of the integrated circuit. The logic elements can be directly routed and connected to driver blocks and programmable routing resources of the logic block in adjacent rows and columns. This permits fast interconnection of signals without using the global programmable interconnect resources. Using similar direct programmable interconnections, the logic blocks can directly connect to the programmable routing resources of the memory blocks without using the global programmable interconnect resources. The present invention also provides technique of flexibly combining or stitching multiple memories together to form memories of a desired size.

In one embodiment, the invention is a programmable logic integrated circuit including a number of programmable interconnect lines arranged in rows and columns. There are a number of logic array blocks between rows and columns of the programmable interconnect lines, where the logic array blocks are arranged in rows and columns and programmably connected to the programmable interconnect lines, and the logic array blocks are programmably configurable to perform logical functions. A number of embedded array blocks are between rows and columns of the programmable interconnect lines, where the embedded array blocks are arranged in a row and each embedded array block includes a RAM block. The RAM block includes at least 2048 bits of memory. The logic array blocks include logic elements. Two embedded array blocks of a row can be programmably combined to provide a larger memory than available with a single embedded array block. A row of embedded array blocks comprises fifteen embedded array blocks. A row of embedded array blocks is programmably configurable to be one 30Kx1 memory, two 14Kx1 memories, three 10Kx1 memories, five 6Kx1 memories, or seven 4Kx1 memories.

The programmable logic integrated circuit may further include a decoder connected to receive a first address and generating a plurality of output control lines, each connected to an enable input one of the embedded array blocks. The output control lines are programmable interconnect lines. Some of the programmable interconnect lines are coupled to provide a second address-to-address inputs of the embedded array blocks. The first address comprises five bits. The second address comprises eleven bits.

In another embodiment, the invention is a programmable logic integrated circuit including a top row of memory blocks formed along a top edge of the integrated circuit and a bottom row of memory blocks formed along a bottom edge of the integrated circuit. A number of logic blocks are arranged in rows and columns and are programmably configurable to implement logic functions. The logic blocks are formed between the top and bottom rows of memory blocks. There are IO bands between the rows of memory blocks. In a specific flip chip implementation, there are no IO bands between the memory blocks and the edge of the integrated circuit. A number of horizontal programmable interconnect lines are programmably connected to the logic blocks. A number of vertical programmable interconnect lines are programmably connected to the logic array blocks. In a specific implementation, the vertical programmable interconnect lines do not extend an entire length from the top to bottom rows of the memory block. In particular, the vertical programmable interconnect lines extend from an inside edge of the top row of memory blocks to an inside edge of the bottom row of memory blocks.

The top row of memory blocks comprises six blocks or more of memory which can be programmably connected together to form larger memory blocks. The logic blocks are grouped into sections of logic blocks and between each section is an IO band. An IO band includes IO pads and input and output circuitry. Each section has three rows of logic blocks and at least forty columns of logic blocks. The programmable logic integrated circuit further includes a phase locked loop circuit formed along with the top row of memory blocks.

A logic block includes a number of logic elements and a driver block, where the number of logic elements is directly programmably connected to a driver block or programmable routing resources of an adjacent logic array block in the same row, without using the horizontal or vertical programmable interconnect. A logic block includes a number of logic elements and a driver block, where the number of logic elements is directly programmably connected to a driver block in an adjacent logic array block in an above row, without using the horizontal or vertical programmable interconnect. A logic block includes a number of logic elements and a driver block, where the number of logic elements is directly programmably connected to a memory block and in particular, the programmable routing resources, in the top row, without using the horizontal or vertical programmable interconnect.

Other objects, features, and advantages of the present invention will become apparent upon consideration of the following detailed description and the accompanying drawings, in which like reference designations represent like features throughout the figures.

DETAILED DESCRIPTION

Figure 1:
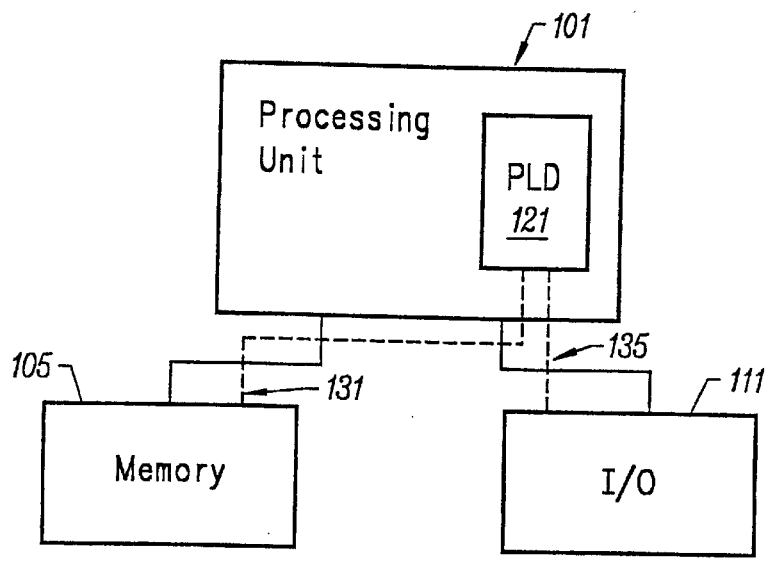
FIG. 1 is diagram of a digital system with a programmable logic integrated circuit.

FIG. 1 shows a block diagram of a digital system within which the present invention may be embodied. The system may be provided on a single board, on multiple boards, or even within multiple enclosures. FIG. 1 illustrates a system 101 in which a programmable logic device 121 may be utilized. Programmable logic devices are sometimes referred to as a PALs, PLAs, FPLAs, PLDs, CPLDs, EPLDs, EEPLDs, LCAs, or FPGAs and are well-known integrated circuits that provide the advantages of fixed integrated circuits with the flexibility of custom integrated circuits. Such devices allow a user to electrically program standard, off-the-shelf logic elements to meet a user's specific needs. See, for example, U.S. Pat. No. 4,617,479, incorporated by reference for all purposes. Programmable logic devices are currently represented by, for example, Altera's MAX®, FLEX®, and APEX™ series of PLDs. These are described in, for example, U.S. Pat. Nos. 4,871,930, 5,241,224, 5,258, 668, 5,260,610, 5,260,611, 5,436,575, and the *Altera Data Book* (1999), all incorporated by reference in their entirety for all purposes. Programmable logic integrated circuits and their operation are well known to those of skill in the art.

In the particular embodiment of FIG. 1, a processing unit 101 is coupled to a memory 105 and an I/O 111 and incorporates a programmable logic device (PLD) 121. PLD 121 may be specially coupled to memory 105 through connection 131 and to I/O 111 through connection 135. The system may be a programmed digital computer system, digital signal processing system, specialized digital switching network, or other processing system. Moreover, such systems may be designed for a wide variety of applications such as, merely by way of example, telecommunications systems, automotive systems, control systems, consumer electronics, personal computers, and others.

Processing unit 101 may direct data to an appropriate system component for processing or storage, execute a program stored in memory 105 or input using I/O 111, or other similar function. Processing unit 101 may be a central processing unit (CPU), microprocessor, floating point coprocessor, graphics coprocessor, hardware controller, microcontroller, programmable logic device programmed for use as a controller, or other processing unit. Furthermore, in many embodiments, there is often no need for a CPU. For example, instead of a CPU, one or more PLDs 121 may control the logical operations of the system. In some embodiments, processing unit 101 may even be a computer system. Memory 105 may be a random access memory (RAM), read only memory (ROM), fixed or flexible disk media, PC Card flash disk memory, tape, or any other storage retrieval means, or any combination of these storage retrieval means. PLD 121 may serve many different purposes within the system in FIG. 1. PLD 121 may be a logical building block of processing unit 101, supporting its internal and external operations. PLD 121 is programmed to implement the logical functions necessary to carry on its particular role in system operation.

Figure 2:
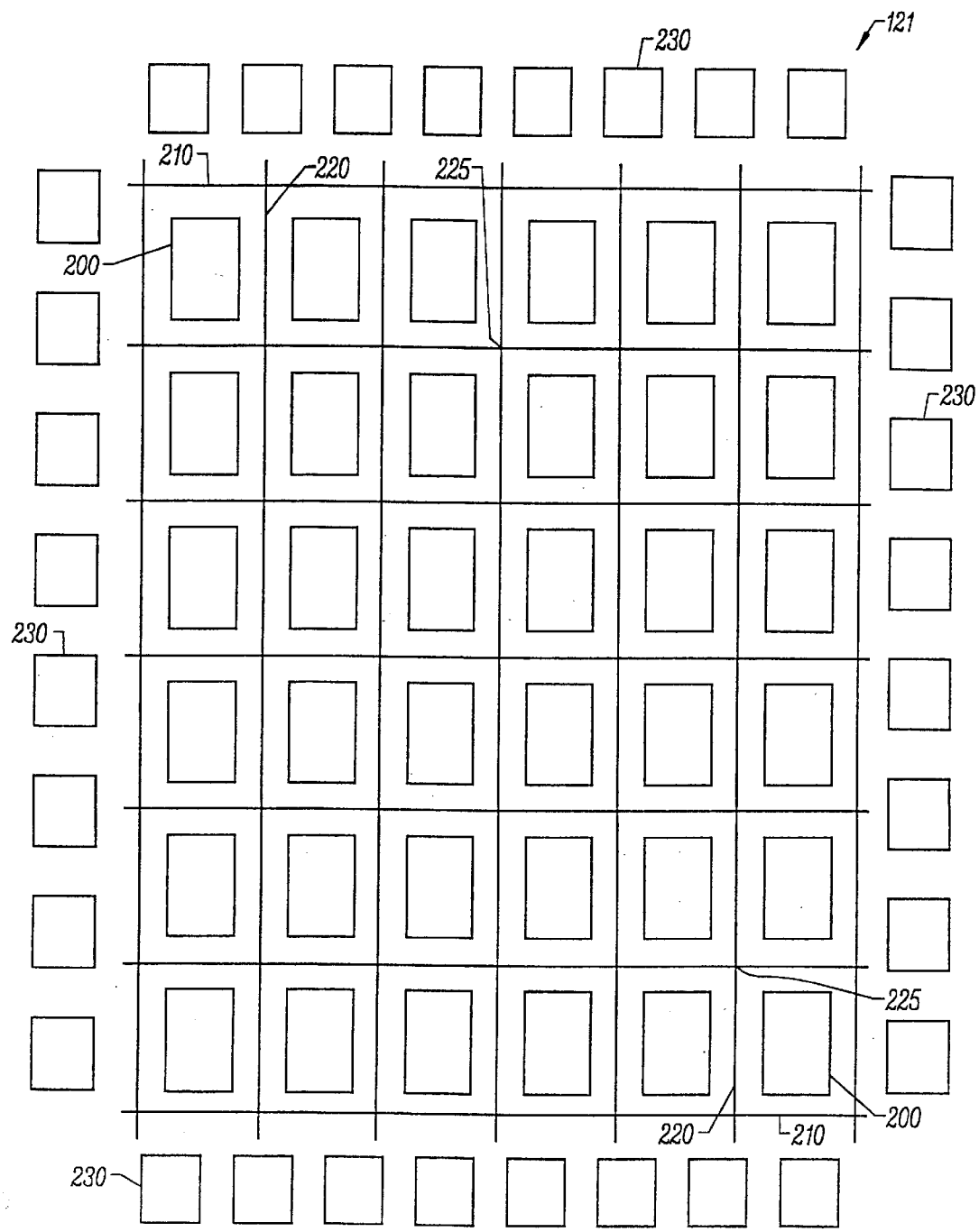
FIG. 2 is a diagram showing an architecture of a programmable logic integrated circuit.

FIG. 2 is a simplified block diagram of an overall internal architecture and organization of PLD 121 of FIG. 1. Many details of PLD architecture, organization, and circuit design are not necessary for an understanding of the present invention and such details are not shown in FIG. 2.

FIG. 2 shows a six-by-six two-dimensional array of thirty-six logic array blocks (LABs) 200. LAB 200 is a physically grouped set of logical resources that is configured or programmed to perform logical functions. The internal architecture of a LAB will be described in more detail below in connection with FIG. 3. PLDs may contain any arbitrary number of LABs, more or less than shown in PLD 121 of FIG. 2. Generally, in the future, as technology advances and improves, programmable logic devices with greater numbers of logic array blocks will undoubtedly be created. Furthermore, LABs 200 need not be organized in a square matrix or array; for example, the array may be organized in a five-by-seven or a twenty-by-seventy matrix of LABs.

LAB 200 has inputs and outputs (not shown) which may or may not be programmably connected to a global interconnect structure, comprising an array of global horizontal interconnects (GHs) 210 and global vertical interconnects (GVs) 220. Although shown as single lines in FIG. 2, each GH 210 and GV 220 line may represent a plurality of signal conductors. The inputs and outputs of LAB 200 are programmably connectable to an adjacent GH 210 and an adjacent GV 220. Utilizing GH 210 and GV 220 interconnects, multiple LABs 200 may be connected and combined to implement larger, more complex logic functions than can be realized using a single LAB 200.

In one embodiment, GH 210 and GV 220 conductors may or may not be programmably connectable at intersections 225 of these conductors. Moreover, GH 210 and GV 220 conductors may make multiple connections to other GH 210 and GV 220 conductors. Various GH 210 and GV 220 conductors may be programmably connected together to create a signal path from a LAB 200 at one location on PLD 121 to another LAB 200 at another location on PLD 121. A signal may pass through a plurality of intersections 225. Furthermore, an output signal from one LAB 200 can be directed into the inputs of one or more LABs 200. Also, using the global interconnect, signals from a LAB 200 can be fed back into the same LAB 200. In specific embodiments of the present invention, only selected GH 210 conductors are programmably connectable to a selection of GV 220 conductors. Furthermore, in still further embodiments, GH 210 and GV 220 conductors may be specifically used for passing signal in a specific direction, such as input or output, but not both.

In other embodiments, the programmable logic integrated circuit may include special or segmented interconnect that is connected to a specific number of LABs and not necessarily an entire row or column of LABs. For example, the segmented interconnect may programmably connect two, three, four, five, or more LABs.

The PLD architecture in FIG. 2 further shows at the peripheries of the chip, input-output drivers 230. Input-output drivers 230 are for interfacing the PLD to external, off-chip circuitry. FIG. 2 shows thirty-two input-output drivers 230; however, a PLD may contain any number of input-output drivers, more or less than the number depicted. Each input-output driver 230 is configurable for use as an input driver, output driver, or bidirectional driver.

Figure 3:
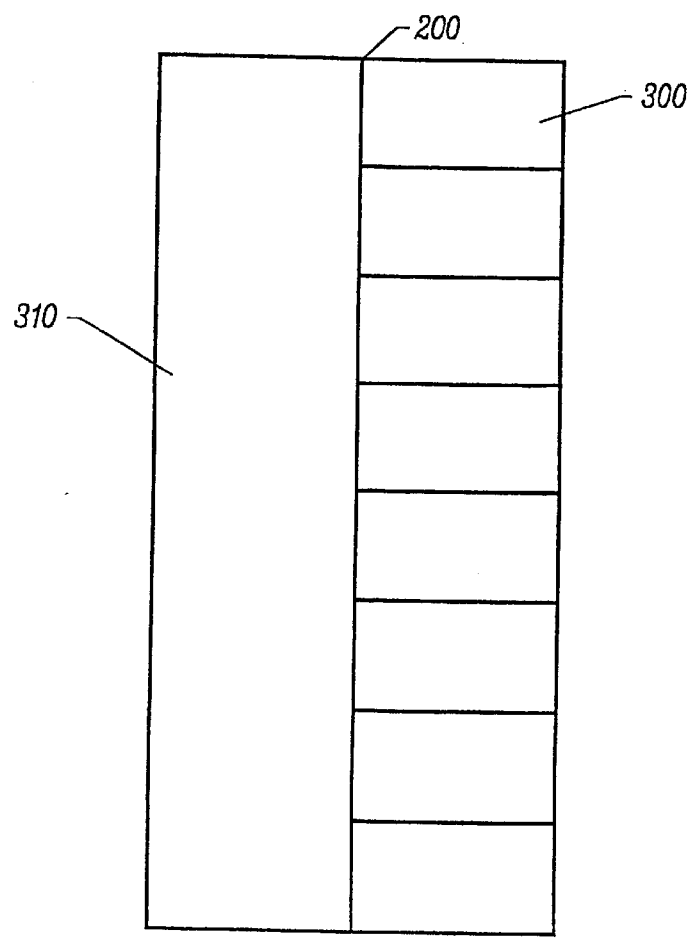
FIG. 3 is a simplified block diagram of a logic array block (LAB).

FIG. 3 shows a simplified block diagram of LAB 200 of FIG. 2. LAB 200 is comprised of a varying number of logic elements (LEs) 300, sometimes referred to as "logic cells," and a local (or internal) interconnect structure 310. LAB 200 has eight LEs 300, but LAB 200 may have any number of LEs, more or less than eight.

A general overview of LE 300 is presented here, sufficient to provide a basic understanding of the present invention. LE 300 is the smallest logical building block of a PLD. Signals external to the LAB, such as from GHs 210 and GVs 220, are programmably connected to LE 300 through local interconnect structure 310. In one embodiment, LE 300 of the present invention incorporates a function generator that is configurable to provide a logical function of a number of variables, such a four-variable Boolean operation. As well as combinatorial functions, LE 300 also provides support for sequential and registered functions using, for example, D flip-flops.

LE 300 provides combinatorial and registered outputs that are connectable to the GHs 210 and GVs 220, outside LAB 200. Furthermore, the outputs from LE 300 may be internally fed back into local interconnect structure 310; through local interconnect structure 310, an output from one LE 300 may be programmably connected to the inputs of other LEs 300, without using the global interconnect structure's GHs 210 and GVs 220. Local interconnect structure 310 allows short-distance interconnection of LEs, without utilizing the limited global resources, GHs 210 and GVs 220.

Figure 4:
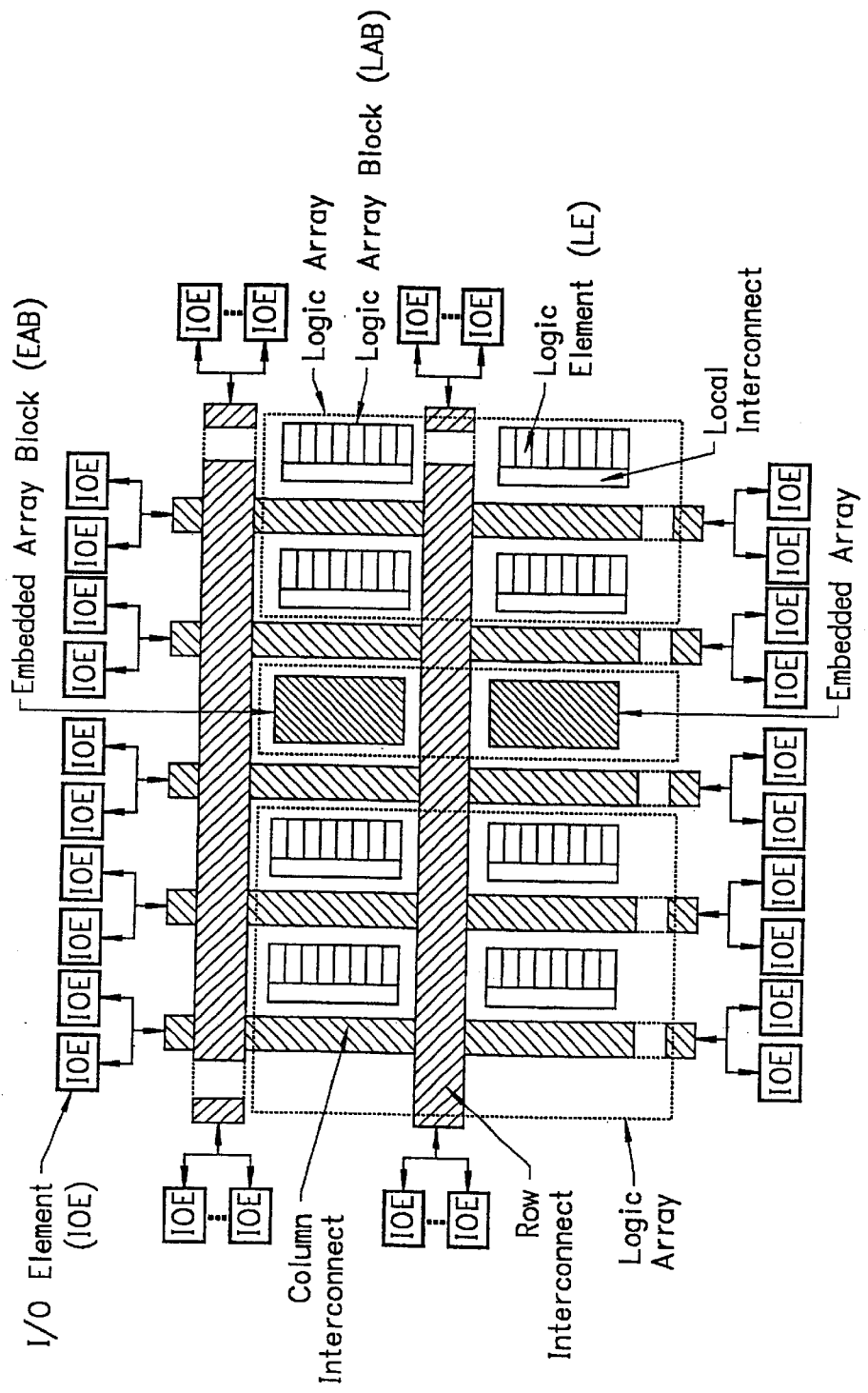
FIG. 4 shows an architecture of a programmable logic integrated circuit with embedded array blocks (EABs).

FIG. 4 shows a PLD architecture similar to that in FIG. 2. The architecture in FIG. 4 further includes embedded array blocks (EABs). EABs contain user memory, a flexible block of RAM. More discussion of this architecture may be found in the *Altera Data Book* (1999) in the description of the FLEX 10K product family and also in U.S. Pat. No. 5,550,782, which are incorporated by reference. In the FLEX 10K products, the memory blocks are arranged in columns, embedded within the array of LABs.

Figure 5:
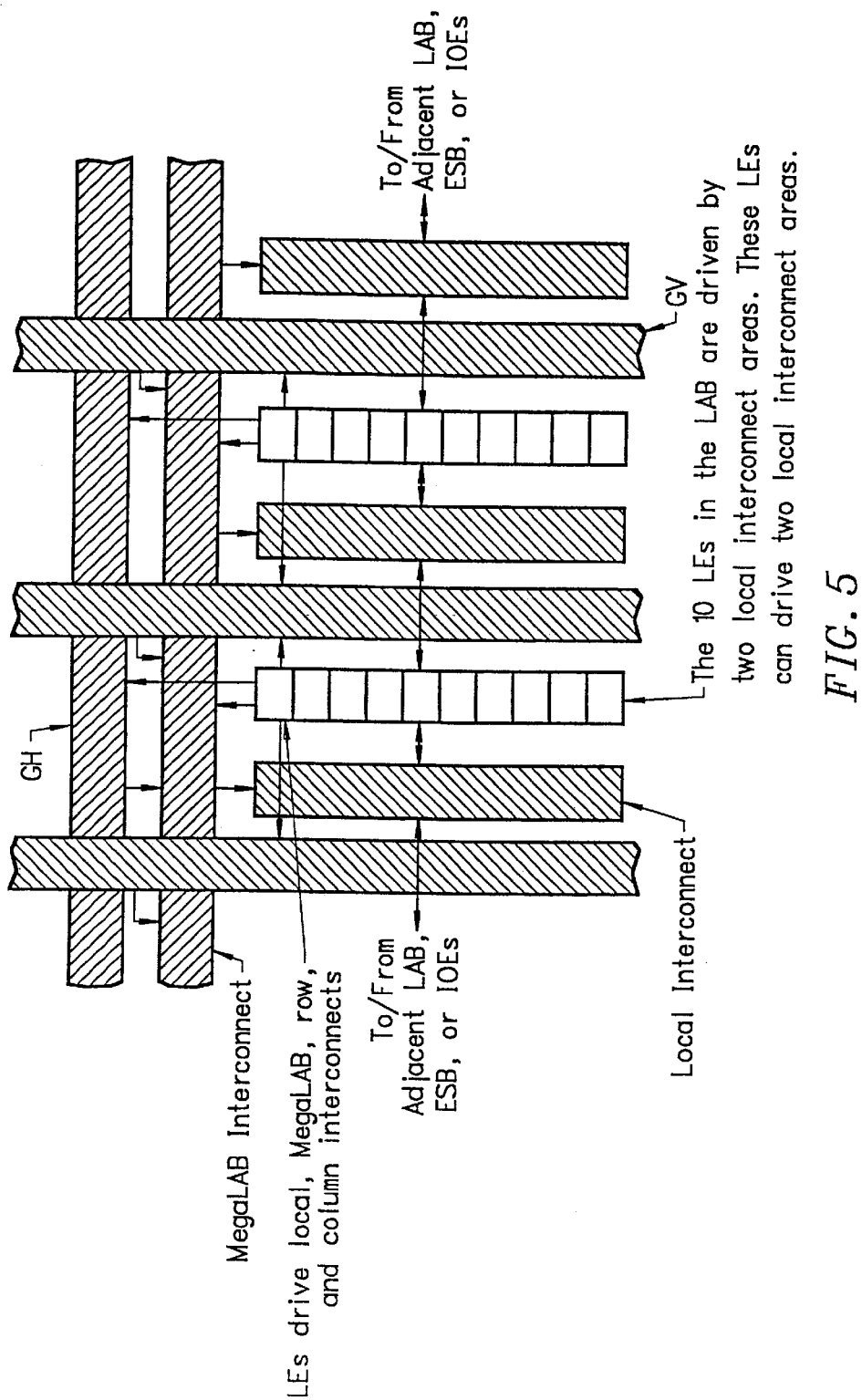
FIG. 5 shows an architecture of a programmable logic integrated circuit with megaLABs.

FIG. 5 shows a further embodiment of a programmable logic integrated circuit architecture. FIG. 5 only shows a portion of the architecture. The features shown in FIG. 5 are repeated horizontally and vertically as needed to create a PLD of any desired size. In this architecture, a number of LABs are grouped together into a megaLAB. In a specific embodiment, a megaLAB has sixteen LABs, each of which has ten LEs. There can be any number of megaLABs per PLD. A megaLAB is programmably connected using a megaLAB interconnect. This megaLAB interconnect may be considered another interconnect level that is between the global interconnect and local interconnect levels. The megaLAB interconnect can be programmably connected to GVs, GHs, and the local interconnect of each LAB of the megaLAB. Compared to the architecture of FIG. 2, this architecture has an additional level of interconnect, the megaLAB interconnect. Such an architecture is found in Altera's APEX™ family of products, which is described in detail in the APEX 20K *Programmably Logic Device Family Data Sheet* (August 1999), which is incorporated by reference. In a specific implementation, a megaLAB also includes an embedded system block (ESB) to implement a variety of memory functions such as CAM, RAM, dual-port RAM, ROM, and FIFO functions. ESBs provide even greater functionality than EABs.

Programmable logic integrated circuits are types of integrated circuits. Programmable logic integrated circuits are sometimes referred to as programmable logic devices (PLDs) or field programmable gate arrays (FPGAs). There is further discussion of programmable logic in the *Altera* 1999 *Device Data Book*, which is incorporated by reference.

One particular design for a programmable logic integrated circuit is Altera's FLEX® 10K product line, which is described in Altera's data book. This programmable logic architecture includes logic array blocks (LABs) and embedded or enhanced array blocks (EABs). U.S. Pat. No. 5,550,782 describes a product with programmable logic and user memory and this pioneering patent is incorporated by reference. The LABs contain logic that is configurable by the user to implement whatever logic functions desired by the user. By using multiple LABs and linking them together, larger and more complex logic functions can be built. The EABs contain memory that can be used for storage of data. For example, the EAB can be used like a RAM or FIFO. The EAB memory can be integrated with the logical functionality programmed by the user. The principles of the present invention applies to programmable logic integrated circuits with EABs or ESBs.

In researching and studying the use of a PLD with embedded memory (or EABs) such as the FLEX® 10K, it was found that in many applications, multiple EABs are often "stitched" together to form larger memories. In typical PLD applications, there tends to be very few independent EAB blocks. And, when using stitched together EABs as logic (in p-term or product term mode), a significant part of the delay is spent on connections between the EAB blocks.

It was found that arranging the EABs in rows will improve performance. An EAB row arrangement came as a result of various investigations: study of possible speed-ups of row horizontal resources; analysis of EAB arrangement in the APEX family; study of components of critical path; and flip chip investigation.

Figure 6:
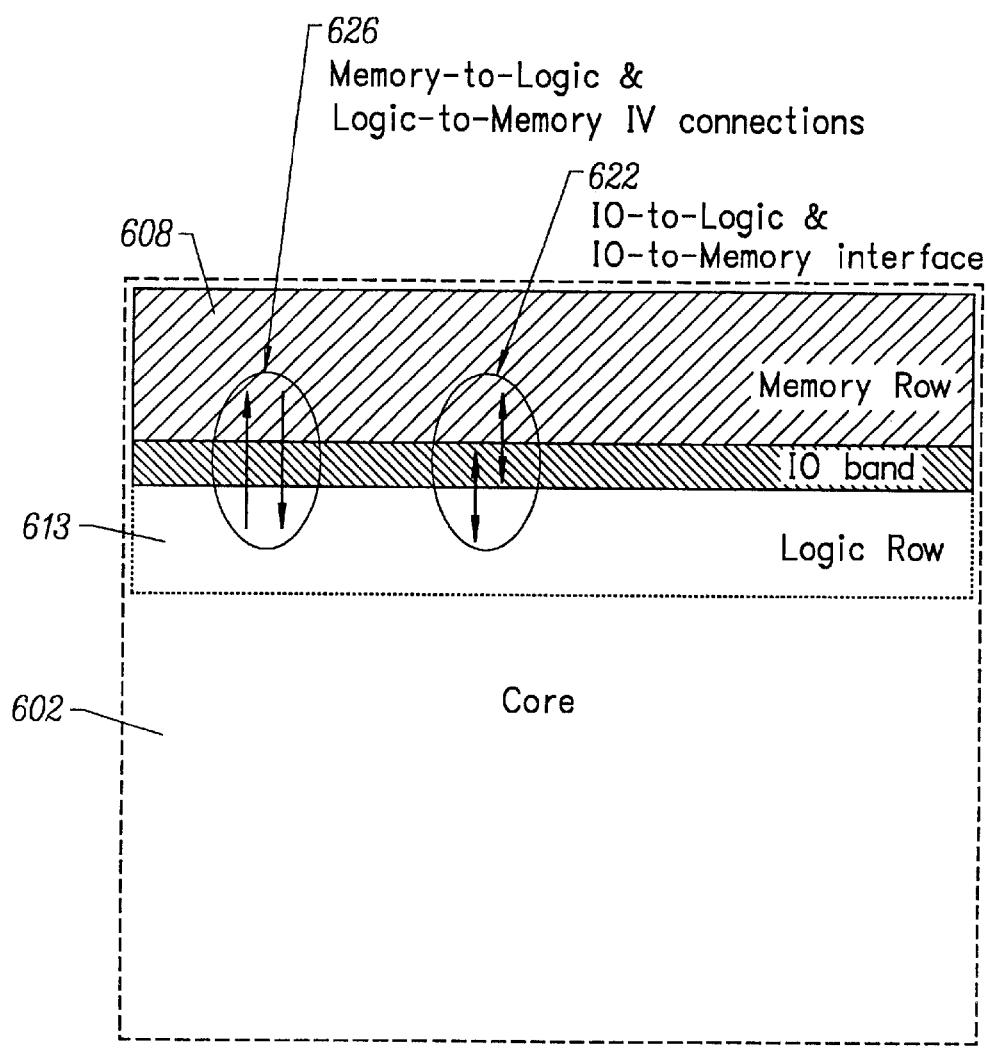
FIG. 6 shows a memory row and logic row of a programmable logic architecture having rows of memory blocks.

FIG. 6 shows a programmable logic (PLD) architecture with rows of memory blocks (e.g., EABs, ESBs). Memory blocks, EABs, and ESBs may be used interchangeably depending on the particular implementation. A row of memory blocks is shown at the edge of a LAB core, and at an edge of the integrated circuit. The figure shows a memory row, an IO (or I/O) band, a logic row, and a core. Interleaving vertical line connections can be added to provide direct memory to logic interface, and/or direct IO-to-logic and IO-to-memory interface.

Core 602 contains rows and columns of LABs and programmable interconnect (such as GVs and GHs), similar as described for the PLD architecture in FIG. 2. A row of memory blocks 608 is placed adjacent a vertical or row edge of the LAB core. Between the memory row and a logic row 613 is an I/O-to-logic and I/O-to-memory interface 622. This interface includes memory-to-logic and logic-to-memory interleaving vertical (IV) connections 626. Also between the memory row and the logic row is an IO band. The IO band includes the pads, input circuit, output circuitry, or IO circuitry, or combinations of these, similar to the input-output driver blocks 230 of FIG. 2. In the present invention, the programmable logic integrated circuit is packaged using flip chip technology.

In typical packaging technology, pads are provided at the edges of the integrated circuit in what is sometimes referred to as a pad ring. Using typical packaging technology, the memory row and logic rows would be formed within the pad ring. In contrast, flip chip packaging technology provides for bump pads at any position within the integrated circuit. Therefore, using flip chip technology, an IO band with bump pads may be placed between the memory row and logic row as shown in FIG. 6, instead of at the edge of the integrated circuit as shown in FIG. 2. Note that the bump pads themselves are not necessarily physically formed within the IO band. The IO band includes the support circuitry, such as IO buffers and circuitry, that will be connected to the bump pads. The bump pads are formed using a top layer metal and may be placed over the logic or memory row or other circuitry, without interfering with the those circuits. By using flip chip technology along with the programmable logic architecture of the present invention, the programmable logic integrated circuit will have improved performance, which will be discussed further below.

Figure 7:
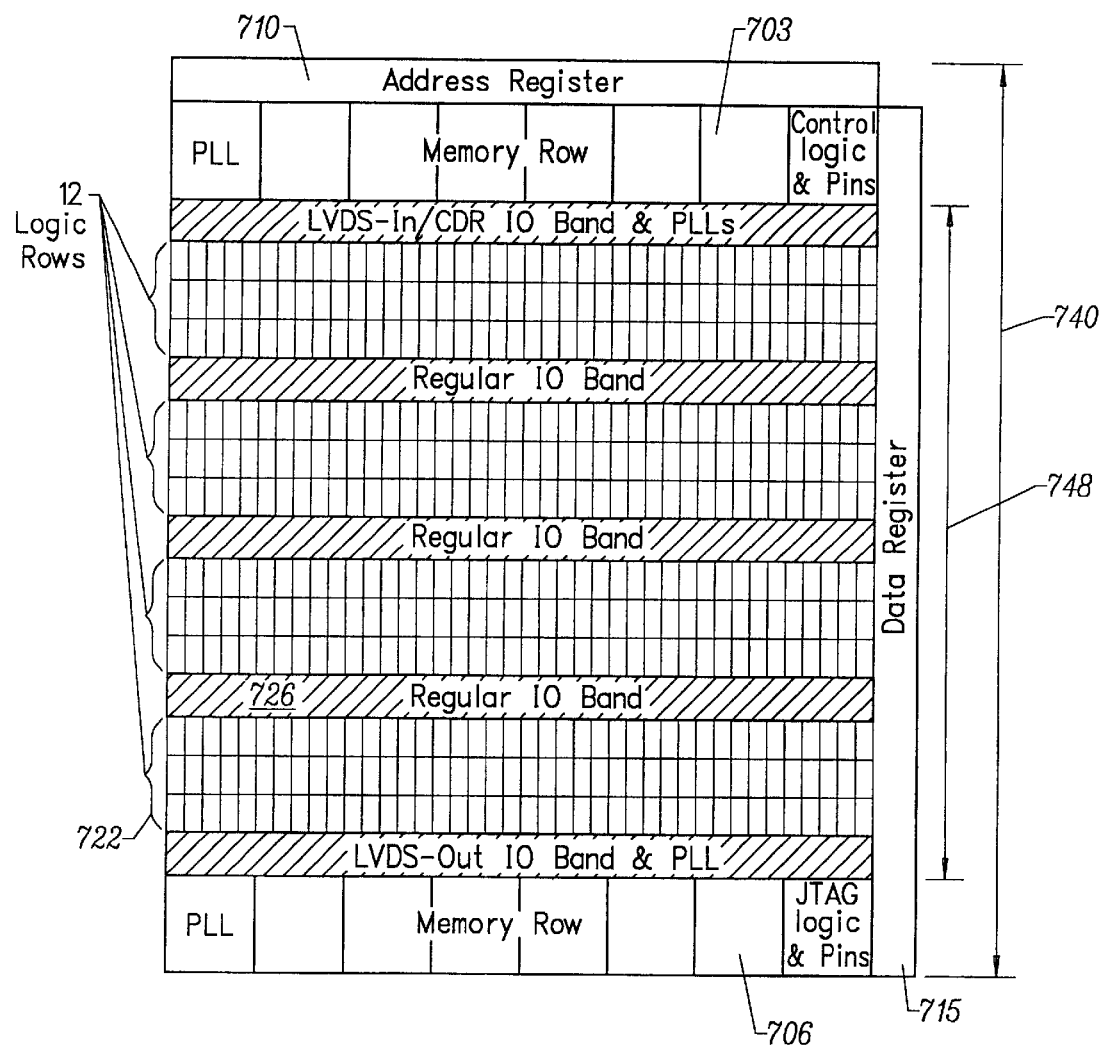
FIG. 7 shows a overall diagram of a programmable logic integrated circuit with memory blocks arranged in rows and IO bands between the memory rows.

FIG. 7 shows an overview diagram of a programmable logic integrated circuit with memory rows. There is a memory row 703 (e.g., EAB or ESB row) at a top row or edge of the integrated circuit and a memory row 706 at a bottom row or edge of the integrated circuit. In the top memory row there is a phase-locked loop (PLL), the EABs or ESBs, and control logic and pins. An address register 710 for the memory is adjacent the top memory row. In alternative embodiments, the address register may also be formed or placed in other locations of the integrated circuit, such as between the top memory row and adjacent IO band, below the memory row. A data register 715 is organized on one side of the integrated circuit.

In this specific implementation, there are twelve logic rows (or rows of LABs) arranged in four sections 722 of three rows each. Between each section of logic rows is a regular IO band 726. The regular IO band includes input-output circuit to programmably route and connect signals to the logic blocks of the logic rows. Signals from outside the integrated circuit are input via bump pads and the IO band. Between the memory row and a logic row section is a low voltage differential signal (LVDS) input IO band and PLL. This is the IO band used for IO-to-logic and IO-to-memory described in FIG. 6. This IO band programmable routes and connects signals to the memory and logic blocks. This IO band also includes LVDS input buffers for high-speed input. There are no IO bands between the outside edges of the memory row and edges of the integrated circuit.

By using flip chip technology and arranging the ESBs in rows at the edges or peripheries of the integrated circuit, this generally increases the performance on the programmable logic integrated circuit for a number of reasons. In an implementation where the memory blocks are in the middle of the LAB array (e.g., column), the programmable interconnect is lengthened by the width or the length of the EAB. This can be a considerable distance since a typical EAB can be the wide as five LABs or more. By arranging the ESBs at the edge of the integrated circuit and placing the IO band adjacent the inside edge of the row of ESBs, the programmable interconnect is shortened since it does not need to run across the width or length of an ESB. The inside edge of the row of ESBs is adjacent the logic row or the edge of the row of ESBs nearest to the core of the integrated circuit. The programmable interconnect typically needs to extend to the IO band circuitry. However, in the present invention, because the IO band is inside the memory row, and not between the memory row and edge of the integrated circuit, the programmable interconnect only needs to extend to the inside edges of the memory rows. This shortens the vertical programmable interconnect of the integrated circuit, thus improving performance.

To illustrate this point, line 740 is the representative length of a programmable interconnect line that extends the full length of the integrated circuit, including the length of the memory blocks (to the outside edges of the ESBs). However, as represented by line 748, when the programmable interconnect only extends to the inside edge of the memory blocks, the length of the programmable interconnect is shorter. In particular, the vertical programmable interconnect lines extend from an inside edge of the top row of memory blocks to an inside edge of the bottom row of memory blocks. This reduces capacitance and loading, which improves the programmable logic performance.

ESBs are typically wider than a single LAB. In a specific implementation, an ESB is five LABs wide. Therefore, by arranging the ESBs into rows, the horizontal programmable interconnect lines will be shorter because the integrated circuit is less wide. Although the integrated circuit is taller, lengthened in the vertical direction, the vertical programmable interconnect lines are not lengthened greatly because the lines do not run across or through the ESB. The vertical programmable interconnect lines stop at the edge of the ESB. Since the vertical programmable interconnects do not need to extend through the ESBs, space is saved in the ESB row and may be used to provide for more internal ESB signal and other routing. This increases the overall functionality and performance of the ESB.

Furthermore, when ESBs and LABs are mixed in a single row, the programmable interconnect resources are typically tuned for the LABs or certain compromises are made so that the programmable routing resources are not necessarily optimum for memory blocks. When LABs and ESBs share programmable routing resources, sacrifices are made to allow both to operate well. By organizing the ESBs together in a row, however, the programmable routing resources for the ESB can be better optimized since the ESB row does not have LABs. In fact, the programmable routing resources for the ESB row can be optimized especially for ESBs. Also, the programmable interconnect resources for the logic rows can be optimized especially for LABs and LEs, and no compromises need to be made for ESB memory blocks. The IO band includes I/O pads, input pads, input circuitry, input/output circuitry. By having the IO bands embedded within the logic array blocks, this reduces the distances needed to route signals from external to the integrated circuit. This further enhances the performance of the integrated circuit.

The composition of the programmable interconnect resources for an ESB row will generally be different compared to a logic or LAB row. The ESB row will have more numbers of conductors in its programmable interconnect resources because more wires are needed to support memory operations, such as interconnections for data and addresses. Also, since ESBs are five LABs wide, some of the shorter programmable interconnections are not needed. So, generally, an ESB row will have more programmable interconnect resources that are longer when compared to a logic row.

Although this discussion is primarily focusing on ESBs organized in rows at the peripheries of the integrated circuit, the invention would also analogously be applicable to form ESBs organized in columns at the peripheries of the integrated circuit. Since flip chip technology is used, the IO bands will be formed within the inside edges of the columns of ESBs and not between the ESBs and at the integrated circuit edge. The horizontal programmable interconnect lines will be shorter since they only need to extend to the inside edges of the ESB columns.

In specific implementations, there will be six ESBs or ten ESBs per row. One EAB or ESB block will be 2K or 4K. An EAB or ESB block may also be larger than 4K. The width and depth size of the memory can be programmably adjustable. For example, a 4K EAB block can be programmably arranged as 4096x1, 2048x2, 1024x4, 512x8, and so forth. Multiple EABs can be combined and stitched together to form larger memories.

The implementation in FIG. 7 has 12 rows with 40 LABs and 2 EAB rows. There are 4800 LEs and 48K bits total of memory. In other implementations of a programmable logic integrated circuit, the number of logic rows and LABs per row will vary. For example, one implementation has 6 rows of 40 LABs each and 2 EAB rows. Each logic section has three rows of LABs. There are 2400 LEs and 48K bits total of memory. Another implementation has 9 rows of 40 LABs each and 2 EAB row. Each logic section has three rows of LABs. There are 3600 LEs and 48K bits of memory total. Another implementation has 9 rows of 80 LABs each and 2 EAB rows. There are 7200 LEs and 112K bits of memory total. Another implementation has 14 rows of 80 LABs each and 2 EAB rows. There are 11,200 LEs and 112K bits of memory total. Another implementation has 18 rows of 80 LABs each and 2 EAB rows. There are 14400 LEs and 112K bits of memory total.

Figure 8:
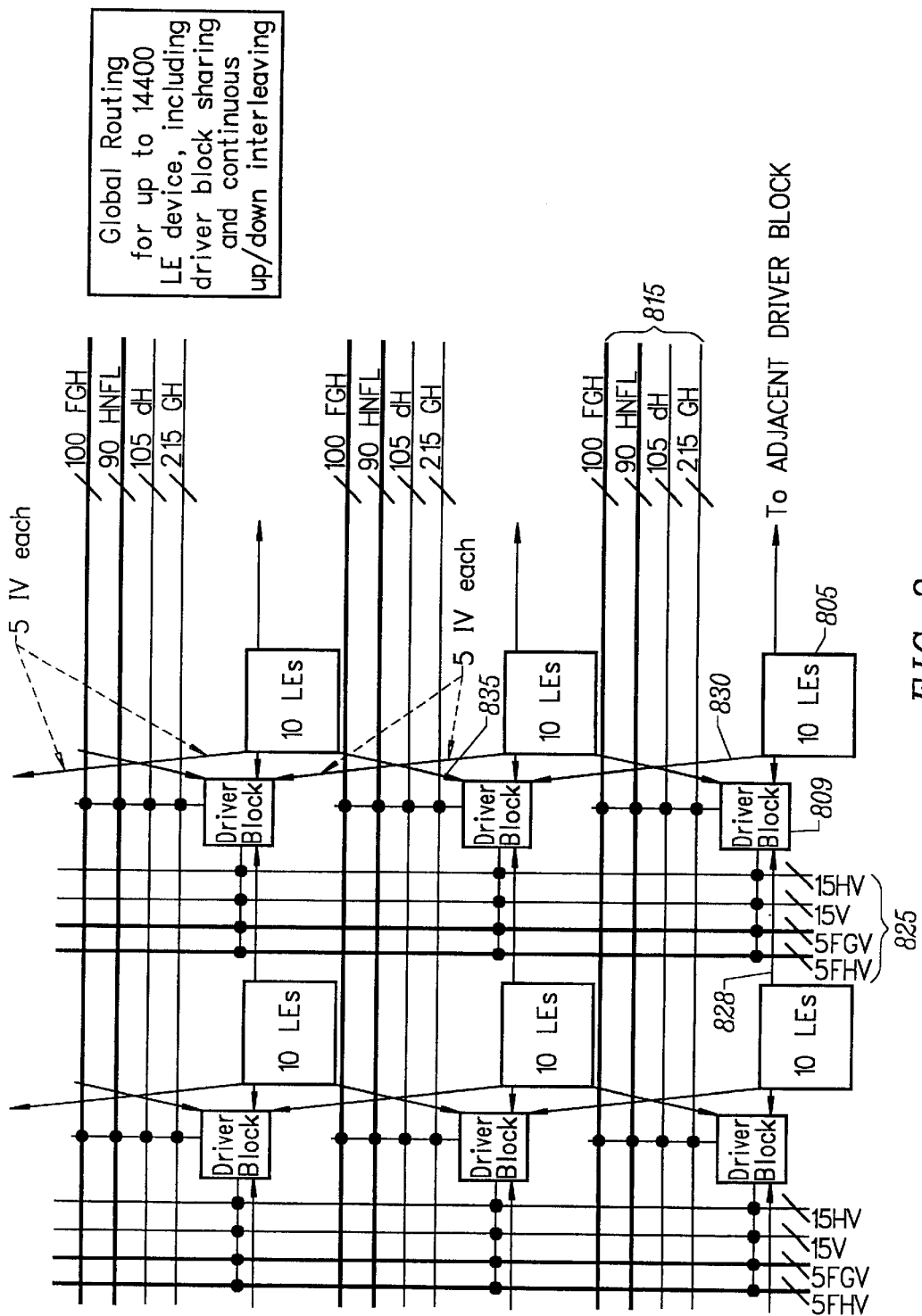
FIG. 8 shows a more detailed diagram of the programmable interconnect routing and interleaving vertical lines of the programmable logic integrated circuit.
Figure 9:
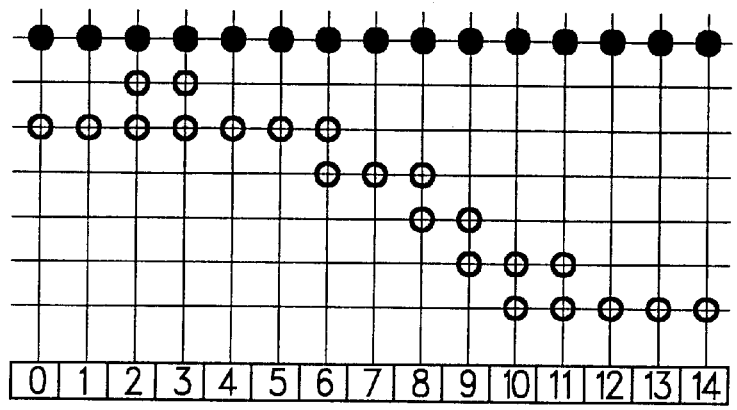
FIG. 9 shows a partially populated stitching pattern to form one 30K memory.

FIG. 8 shows a more detailed diagram of the routing within a 3-by-2 portion of a LAB array. Each LAB includes ten LEs 805 and a driver block 809. In other embodiments, the LABs may include any number of LEs, such as eight, sixteen, twenty, and twenty-four. The LEs include the configurable logic circuitry configurable by the user to implement logical functions, both combinatorial and registered. The driver block includes driver, multiplexer, and other circuitry to drive out of the LAB to the programmable routing resources for that row.

The horizontal programmable interconnect 815 includes GH, dH, HNFL, and FGH lines. These for programmable interconnect of various lengths and special purposed. For example, there may be half-length line or "fast" GH lines (i.e., FGH). The vertical programmable interconnect 825 includes HV, V, FGV, and FHV lines. Each LE of a LAB can directly programmably connect to driver block 809 of the LAB itself and to the driver block of the adjacent LAB in the same row (to the right of the LAB) through a direct connection 828.

Another feature of the invention is that LEs also directly programmably connect (through direct connections 830 and 835) to the driver blocks or programmable resources in the adjacent row above and adjacent row below. Connections 835 and 830 are referred to as interleaving vertical or IV lines. The ESB row also has IV lines, similarly as shown for LABs. IV lines are used for LAB-to-LAB, ESB-to-LAB, and LAB-to-ESB communication between different rows of LABs. IV lines provide direct connections from a particular row (LAB or ESB) to the routing resources of an adjacent row (LAB or ESB), without using the programmable interconnect resources, 825. Each IV line 830 and 835 includes a number of conductors. For example, in one implementation, there are five IV conductors between LABs or ESBs. These connections between the LAB and the adjacent driver blocks, in an adjacent row and column, are direct connections; the horizontal or vertical programmable interconnects, 815 and 825, are not used in the connection path. The IV connections allow one row, logic or memory, to connect to another row's (logic or memory) horizontal programmable interconnect resources 815. Moreover, the IV lines improve performance. With IV lines, any logic or memory row can reach another row's programmable routing resources as fast as it can reach its own row's programmable routing resources.

Moreover, in a programmable logic integrated circuit where a row has LABs mixed with ESBs, the ESBs can reach the programmable resources of other LABs in the same row directly using the horizontal interconnects. In the architecture of the present invention, ESBs are grouped into one row and IV lines allow jumps to other rows horizontal interconnects directly. Therefore, with IV lines, the connections between ESBs to a LAB row's programmable routing resources will not be slower than the architecture with LABs and ESBs. Also, LEs in the top or bottom logic row for the present architecture can reach more numbers of ESBs with relative fast performance than in the mixed LAB and ESB row architecture, which generally has fewer ESBs per row.

For the row of LABs adjacent the EAB (or ESB) or memory row, the IV lines from the LABs can be used to programmably connect to the ESB, and IV lines can be used to programmably connect from the ESB to the LABs in the adjacent row. This allows a direct connection between the LABs and ESBs in the row above (or below) without using the vertical programmable interconnect. These relatively short interconnections (IV lines) are generally much faster than the horizontal interconnects because there is less capacitance and loading. So, the combined IV and horizontal interconnect delays in this implementation should not be slower than the horizontal interconnect delay along in the mixed LAB/ESB row implementation because it has longer (slower) horizontal interconnects. Also, by using these direct connections, the longer vertical programmable interconnect resources may be saved for other purposes.

An aspect of the invention is top and bottom EAB or ESB row placement. This will increase inter-row LE-to-LE speed. This will increase IO-to-LE speed (with flip chip PLD). This will increase the speed of some IO-to-memory connections, without penalty to IO-to-LE speed. By arranging the EABs or ESBs in rows, this will enhance memory performance, enhance logic performance, increase speed of IO interface, and provide a more efficient layout.

An aspect of the invention is to separate EABs (or ESBs) and logic by placing multiple EAB (or ESB) blocks in memory rows. In a specific implementation, any number of EABs (six, ten, or more) are grouped into a single row. Another aspect of the invention is to allow for interleaving vertical (IV) line connections between EABs (or ESBs) and LABs in adjacent rows. A further aspect is to place EAB rows on top and bottom of the core, and to terminate core vertical writing at memory-to-logic interface. This will permit faster interrow LE-to-LE speed, and free additional routing metal channels within the EAB (or ESB). A yet further aspect is that IO bands can be placed on memory-to-logic interface to allow some IOs to have fast IO-to-memory connections without a penalty to IO-to-logic speed.

A further aspect of the invention is the ability to fast stitch multiple EAB (or ESB) blocks together will increase memory and p-term EAB performance. With rows of EABs, this will speed-up both regular and p-term modes of EAB operation. EAB-to-logic performance will not suffer due to availability of fast inter-row connections. An increased size of core of logic can feed the EAB fast. Increased layout efficient (area and time-wise) will result because LABs and EABs can be drawn independently. Iner-row LE-to-LE speed will increase. Provides square-root LE to memory bits dependence.

The Altera 20K product family provides tristatable GV lines so that multiple EABs in x1 mode can be stitched together to form deeper memories. For example, two 2K-bit EABs can be stitched together to form a 4Kx1 memory and four EABs can form an 8Kx1 memory. The Altera 20K tristatable GV pattern supports an address depth in the power of two efficiently. For example, the 20K400 product has twenty-six EABs per column, so it can support thirteen 4Kx1 memories or six 8Kx1 memories. However, it does not guarantee to support five 10Kx1 memories. A more populated GV pattern can support more deep-memory combinations but it requires more area. Furthermore, speed is affected because each EAB bit 0 output is required to drive more diffusion loading.

In the invention, EABs or ESBs are grouped together in rows such that tristatable GH lines are provided to support deep memories. FIGS. 9 to 12 show an ESB row with fifteen ESBs with can be stitched together with partially populated multiplexing. An specific optimized multiplexing structure is shown in FIGS. 9 to 12 such that it only requires seven tristatable GH or programmable interconnect lines (horizontal lines) with thirty-seven pass gates (circles) to support any possible deep memory combination. These pass gates or other programmable connection circuits are selectively programmed to implement the desired memory block stitching. As desired, the horizontal and vertical conductors will be connected together at the intersection "circles." In the figures, filled in or darkened circles indicate a connection for illustration purposes. The stitch pattern provides relatively high performance because only a maximum of three pass gates are needed per ESB output (shown as vertical lines in the figures). This minimizes the loading at the ESB outputs.

Figure 10:
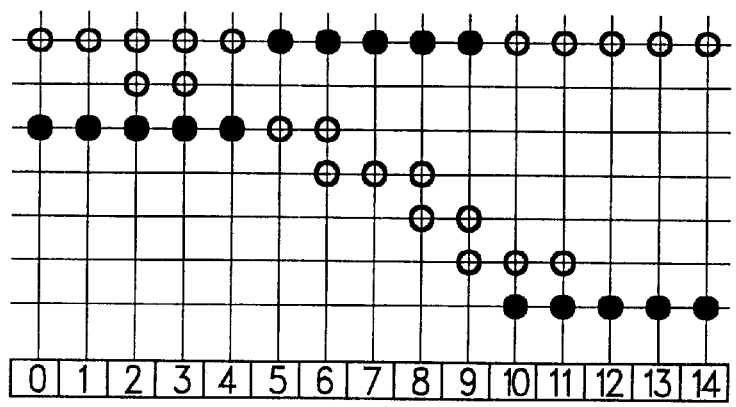
FIG. 10 shows a partially populated stitching pattern to form three 10K memories.
Figure 11:
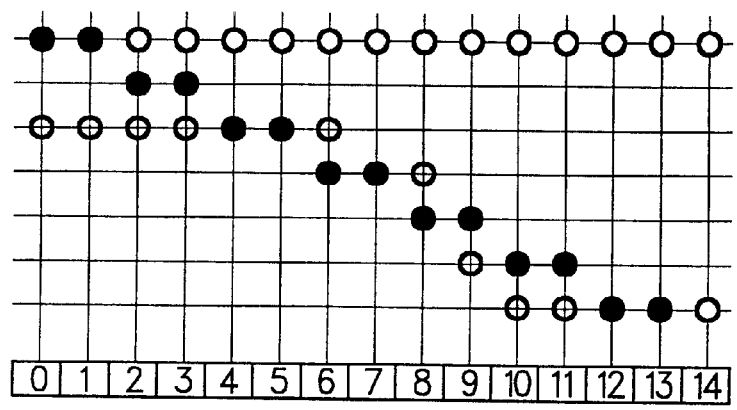
FIG. 11 shows a partially populated stitching pattern to form seven 4K memories.
Figure 12:
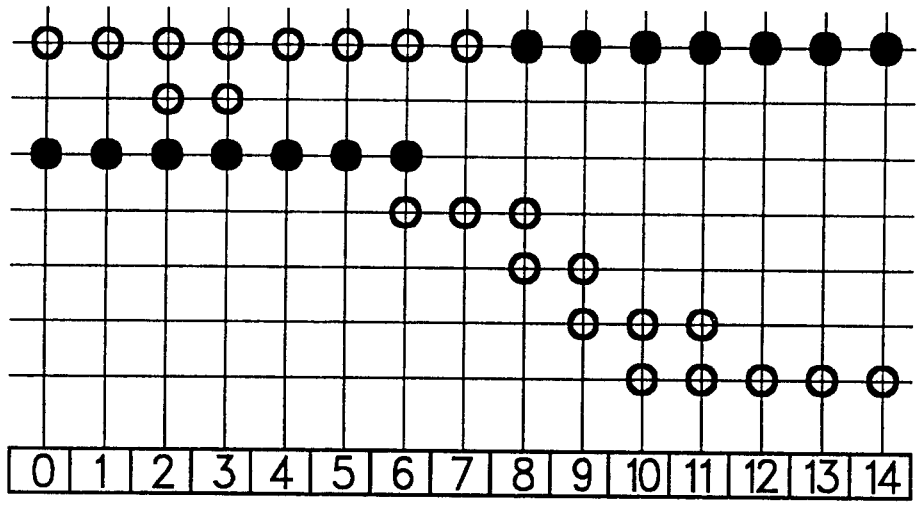
FIG. 12 shows a partially populated stitching pattern to form two 15K memories.
Figure 13:
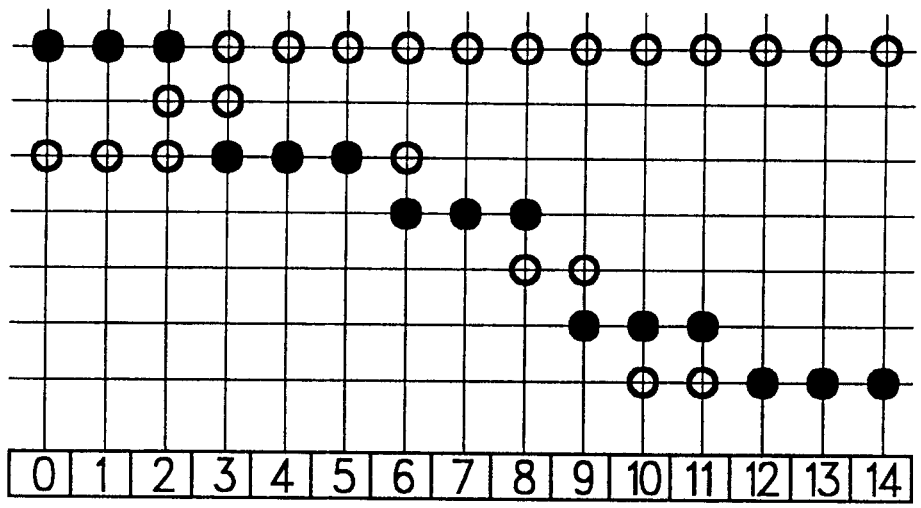
FIG. 13 shows a partially populated stitching pattern to form five 6K memories.

For example, FIGS. 9 to 12 show the 15 ESBs stitched together to form a 30Kx1 memory (assuming 2K ESB sizes). FIG. 10 shows the ESBs stitched together to form three 10Kx1 memories. FIG. 11 shows a seven 4Kx1 memories. FIG. 12 show two 14Kx1 memories. FIG. 13 shows five 6Kx1 memories. In fact, all other possible memory combinations are supported as long as the total memory bits is less than 30K-bits (i.e., 2K x 15 blocks) and each memory depth is 2-multiple of 2K (e.g., 4K, 6K, 8K, 10K, and so forth). For example, 4K/4K/4K/4K/6K/8K, 6K/6K/8K/10K, or 10K/20K combination can easily be supported. Similar patterns can be created to support different number of ESBs per row with different ESB size. For example for an ESB size of 4K, the total sizes will be two times the numbers discussed above.

Partially populated multiplexing is used rather than fully populated multiplexing. Fully populated multiplexing refers to having a connection at every intersection to allow every possible stitching combination. However, this approach requires many more than 37 pass gates. For the implementation show, there would be 105 (7x15) pass gates. Partially populated multiplexing with the pattern shown in the figures provides for stitching of the ESB with the desired sizes, but at the same time, does not require as much integrated circuit area as fully populate multiplexing. FIGS. 9 to 12 include that all memory depth combinations are supported with a maximum of three output loading per ESB (in x1 mode).

FIGS. 9 to 12 show merely one example of a stitching pattern. There are many different combinations of stitching patterns that are equivalent to the one shown in FIGS. 9 to 12 that would allow the same resulting stitching of ESB blocks. Any one of these combinations may also be used.

The Altera 20K product family provides an embedded address decoder (cascade address decoder) in each ESB. Although each ESB only has 2K bits of memory with an 11-bit address, a total of sixteen address bits can be sent directly to each ESB where the upper five bits of the address decoded by a dedicated single-output decoder. As the result, no external decoding logic is required for up to 64K deep memories. However, extra die area is required for each ESB to include the embedded decoder, and more LAB lines and associated PIA (programmable interconnect resources) are needed for the five extra address lines per port.

Figure 14:
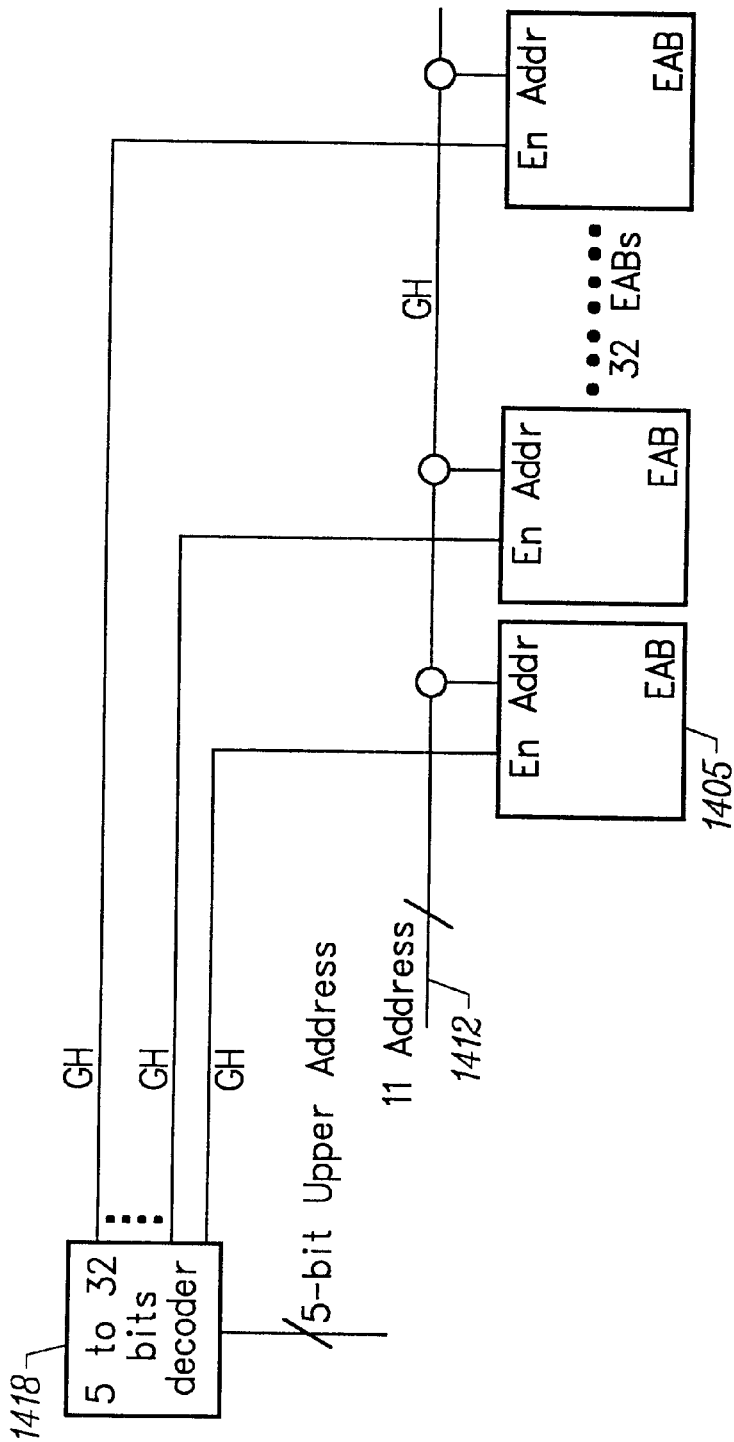
FIG. 14 shows a decoder circuit scheme for forming deep memories from multiple memory blocks.

In the invention, the EABs or ESBs are grouped into rows. Multiple EABs or ESBs can be accessed directly using EAB GH lines. Dedicated circuitry per EAB row can be added to support various peripheral EAB functions. For example, the cascade decoder in each 20K product EAB can be replaced by a single upper address decoder per EAB row. This is shown in FIG. 14. This row-level decoder requires fewer transistors than the distributed version and does not need the extra LAB lines per EAB. This decoder circuitry can be used to form deep memories by using decoder circuitry. There may be one decoder for each ESB row enable this combining or stitching together of the memories. Since the decoder will be localized and grouped in the same row as the memory, this will ensure the decoding is fast.

The stitch decoder may also be implemented using programmable logic instead of a dedicated circuit. However, to minimize impact on programmable interconnect use, a dedicated decoder is preferred.

In FIG. 14, there are 32 EABs or ESBs 1405. There are 11 address lines 1412 for the EABs, which are connected by a GHs. Each of the enable (En) inputs of the EABs is connected by a GH line to a decoder 1418 used to decode the 5-bit upper address. The decoder will be a 5-to-32-bit decoder. Consequently, based on the 5-bit upper address input, one of the EABs will be enabled. Then, the 11-bit address is used to select the particular bit of the selected EAB for outputting to the data bus.

Other peripheries for EAB can be supported in a similar fashion. For example, a dedicated counter circuitry with overflow/underflow detection can be provided to support deep FIFO/LIFO memories efficiently. This circuitry would be grouped with the EAB at the peripheries of the integrated circuit.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

What is claimed is:

1. A programmable logic integrated circuit comprising:
    a plurality of programmable interconnect lines arranged in rows and columns;
    a plurality of logic array blocks between rows and columns of the programmable interconnect lines, wherein the logic array blocks are arranged in rows and columns and programmably coupled to the programmable interconnect lines, and the logic array blocks are programmably configurable to perform logical functions;
    a plurality of embedded array blocks arranged in a row, programmably coupled to the programmable interconnect lines, wherein each embedded array block includes a RAM block, a first embedded array block is in a column j, and a second embedded array block is in a column j+1, wherein j is an integer; and
    a decoder coupled to receive a first address and generating a plurality of output control signals, each coupled to an enable input of one of the embedded array blocks, wherein the output control signals are coupled to the embedded array blocks via the programmable interconnected lines.

2. A programmable logic integrated circuit comprising:
    a top row of memory blocks formed along a top edge of the integrated circuit;
    a bottom row of memory blocks formed along a bottom edge of the integrated circuit;
    a plurality of logic blocks, arranged in rows and columns, programmably configurable to implement logic functions, formed between the top and bottom rows of memory blocks;
    a plurality of horizontal programmable interconnect lines, programmably coupled to the logic blocks; and
    a plurality of vertical programmable interconnect lines, programmably coupled to the logic blocks.

3. The programmable logic integrated circuit of claim 2 further comprising:
    a plurality of IO bands comprising input and output circuitry, formed between the top and bottom rows of memory blocks.

4. The programmable logic integrated circuit of claim 3 wherein no IO bands are formed between the top row of memory block and the top edge of the integrated circuit.

5. The programmable logic integrated circuit of claim 4 wherein no IO bands are formed between the bottom row of memory blocks and the bottom edge of the integrated circuit.

6. The programmable logic integrated circuit of claim 2 wherein the vertical programmable interconnect lines extend from an inside edge of the top row of memory blocks to an inside edge of the bottom row of memory blocks.

7. The programmable logic integrated circuit of claim 2 wherein the top row of memory block s comprises six blocks of memory which can be programmably coupled to form larger memory blocks.

8. The programmable logic integrated circuit of claim 2 wherein the logic blocks are grouped into sections of logic blocks and between each section is an IO band.

9. The programmable logic integrated circuit of claim 8 wherein the IO band comprises IO pads and input circuitry.

10. The programmable logic integrated circuit of claim 8 wherein each section has three rows of logic blocks and at least forty columns of logic blocks.

11. The programmable logic integrated circuit of claim 2 further comprising:
    a phase locked loop circuit formed along with the to p row of memory blocks.

12. The programmable logic integrated circuit of claim 2 wherein a logic block comprises:
    a plurality of logic elements and a driver block, wherein the plurality of logic elements are directly programmably coupled to a driver block of an adjacent logic array block in the same row, without using the horizontal or vertical programmable interconnect.

13. The programmable logic integrated circuit of claim 2 wherein a logic block comprises:
    a plurality of logic elements and a driver block, wherein the plurality of logic elements are directly programably coupled to a driver block in an adjacent logic array block in an above row, without using the horizontal or vertical programmable interconnect.

14. The programmable logic integrated circuit of claim 2 wherein a logic block comprises:
    a plurality of logic elements and a driver block wherein the plurality of logic elements are directly programmably coupled to a driver block in an adjacent logic array block in a row below, without using the horizontal or vertical programmable interconnect.

15. The programmable logic integrated circuit of claim 2 wherein each row of memory blocks further comprises a grid of stitching conductors to programmably stitch one memory block to other memory blocks in the row to form larger memory blocks.

16. The programmable logic integrated circuit of claim 15 wherein the grid comprises fourteen first stitch conductors coupled to the stitch memory blocks and seven second stitch conductors, transverse to the first stitch conductors.

17. The programmable logic integrated circuit of claim 16 further comprising pass gates to programmably couple first and second stitch conductors at intersections between a first conductor of the first stitch conductors and a first and third conductor of the second stitch conductors,
    a second conductor of the first stitch conductors and the first and third conductors of the second stitch conductors,
    a third conductor of the first stitch conductors and the first and third conductors and a second conductor of the second stitch conductors, and
    a fourth conductor of the first stitch conductors and first, second and third conductors of the second stitch conductors.

18. The programmable logic integrated circuit of claim 17 further comprising pass gates at intersections of a fifth conductor of the first stitch conductors and the first and third conductors of the second stitch conductors, a sixth conductor of the fast stitch conductors and to first and third conductors of the second stitch conductors, a seventh conductor of the first stitch conductors and the first and third conductors and a fourth conductor of the second stitch conductors, and an eighth conductor of the first stitch conductors and the first and fourth conductors of the second stitch conductors.

19. The programmable logic integrated circuit of claim 18 further comprising pass gates at intersections of a ninth conductor of the first stitch conductors and the first and fourth conductors and a fifth conductor of the second stitch conductors, a tenth conductor of the first stitch conductors and the first and fifth conductors and a sixth conductor of the second stitch conductors, an eleventh conductor of the first stitch conductors and the fist and sixth conductors and a seventh conductor of the second stitch conductors, and a twelfth conductor of the first stitch conductors and the first, sixth, and seventh conductors of the second stitch conductors.

20. The programmable logic integrated circuit of claim 19 further comprising pass gates at intersections of a thirteenth conductor of the first stitch conductors and the first and seventh conductors of the second stitch conductors, a fourteenth conductor of the first stitch conductors and the first and seventh conductors of the second stitch conductors, and a fifteenth conductor of the first stitch conductors and the first and seventh conductors of the second stitch conductors.

21. The programmable logic integrated circuit of claim 2 further comprising a circuit to stitch the memory blocks in a row comprising:

a decoder circuit coupled to enable inputs of each of the memory blocks.

22. The programmable logic integrated circuit of claim 21 wherein the decoder circuit takes a 5-bit upper address and selectively enables one of the memory blocks.

23. A programmable logic integrated circuit comprising:

a plurality of programmable interconnect lines arranged in rows and columns;

a plurality of logic array blocks between rows and columns of the programmable interconnect lines, wherein the logic array blocks are arranged in rows and columns and programmably coupled to the programmable interconnect lines, and the logic array blocks are programmably configurable to perform logical functions;

a plurality of embedded array blocks, programmably coupled to the programmable interconnect lines, wherein the embedded array blocks are arranged in adjacent columns of a single row and each embedded array block includes a RAM block; and a decoder coupled to receive a first address and generating a plurality of output control signals, each coupled to an enable input of one of the embedded array blocks, wherein the output control signals are coupled to the embedded array via the programmable interconnect lines.

24. A programmable logic integrated circuit comprising:

a plurality of programmable interconnect lines arranged in rows and columns;

a plurality of logic array blocks between rows and columns of the programmable interconnect lines, wherein the logic array blocks are arranged in rows and columns and programmably coupled to the programmable interconnect lines, and the logic array blocks are programmably configurable to perform logical functions;

a first row of embedded array blocks, programmably coupled to the programmable interconnect lines, wherein the first row of embedded array blocks are formed along a first edge of the integrated circuit and each embedded array block includes a RAM block; and a second row of embedded array blocks, programmably coupled to the programmable interconnect lines, wherein the second row of embedded array blocks are formed along a second edge of the integrated circuit, opposite, of the first edge, and each embedded array block includes a RAM block, wherein the logic array blocks are formed between the first and second rows of embedded array blocks.

25. A programmable logic integrated circuit comprising:

a plurality of programmable interconnect lines arranged in rows and columns;

a plurality of logic array blocks between rows and columns of the programmable interconnect lines, wherein the logic array blocks are arranged in rows and columns and programmably coupled to the programmable interconnect lines, and the logic array blocks are programmably configurable to perform logical functions;

a first row of embedded array blocks, programmably coupled to the programmable interconnect lines, wherein the first row of embedded array blocks are formed along a first edge of the integrated circuit and each embedded array block includes a RAM block;

a second row of embedded array blocks, programmably coupled to the programmable interconnect lines, wherein the second row of embedded array blocks are formed along a second edge of the integrated circuit, opposite of the first edge, and each embedded array block includes a RAM block; and a plurality of IO bands comprising input and output circuitry, formed between the first and second rows of memory blocks.

* * * * *